United States Patent [19]

Sugibayashi

[11] Patent Number: 5,305,265
[45] Date of Patent: Apr. 19, 1994

[54] SEMICONDUCTOR MEMORY DEVICE HAVING COLUMN SELECTION CIRCUIT ACTIVATED SUBSEQUENTLY TO SENSE AMPLIFIER AFTER FIRST OR SECOND PERIOD OF TIME

[75] Inventor: Tadahiko Sugibayashi, Tokyo, Japan
[73] Assignee: NEC Corporation, Tokyo, Japan
[21] Appl. No.: 731,239
[22] Filed: Jul. 17, 1991
[30] Foreign Application Priority Data
Jul. 17, 1990 [JP] Japan .................. 2-188530
[51] Int. Cl.⁵ .............................. G11C 7/00
[52] U.S. Cl. .................. 365/194; 365/201; 365/233
[58] Field of Search .......... 365/194, 201, 233
[56] References Cited
U.S. PATENT DOCUMENTS

| | | | |
|---|---|---|---|
| 4,656,612 | 4/1987 | Allan | 365/203 |
| 4,687,951 | 8/1987 | McElroy | 307/269 |
| 4,748,595 | 5/1988 | Mattausch | 365/194 |
| 5,023,840 | 6/1991 | Tobita | 365/201 |
| 5,033,026 | 7/1991 | Tsujimoto | 365/194 |
| 5,051,995 | 9/1991 | Tobita | 365/201 |

FOREIGN PATENT DOCUMENTS 0326183  8/1989  European Pat. Off. .

*Primary Examiner*—John S. Heyman
*Attorney, Agent, or Firm*—Sughrue, Mion, Zinn, Macpeak & Seas

[57] ABSTRACT

The semiconductor memory device according to the present invention has a memory cell array which includes a plurality of memory cells provided in array form and a plurality of bit lines and word lines that are respectively connected to the memory cells, where the bit lines are arranged so as to form a group of paired lines, sense amplifiers which are provided one for each of the bit line pairs, for amplifying the potential difference between the lines of the bit line pair in response to an activating signal, a delay circuit which uses said activating signal as its input signal, for generating a selection signal by giving to said activating signal a delay time that varies in response to a control signal from a switching circuit, and selection switch means for connecting a predetermined one of said bit line pairs and I/O lines in response to said selection signal.

When a read error is detected by a function test, the switching circuit is set so as to generate an active level control signal DS, when the read error is eliminated by the setting, it is possible by setting the switching circuit so as to permanently fix the control signal to the active level to convert articles that had to be classified as defective conventionally to conforming articles, thereby making it possible to contribute to an enhancement of the yield.

6 Claims, 4 Drawing Sheets

SEMICONDUCTOR MEMORY DEVICE HAVING COLUMN SELECTION CIRCUIT ACTIVATED SUBSEQUENTLY TO SENSE AMPLIFIER AFTER FIRST OR SECOND PERIOD OF TIME

BACKGROUND OF THE INVENTION

1. Field of the Invention

The present invention relates to a semiconductor memory device, and more particularly, to a semiconductor memory device which enables the use of articles that used to be classified conventionally as defective as conforming articles without relying upon the use of a redundant circuit.

2. Description of the Prior Art

A semiconductor memory device includes a memory cell array consisting of a plurality of memory cells provided in array form and a plurality of bit lines and word lines that are respectively connected to the memory cells, and a row decoder and a column decoder that are respectively arranged adjacent to the memory cell array so as to select a specified memory cell. The plurality of bit lines in the memory cell array includes a plurality of bit line pairs, the levels of lines of each bit line pair becoming complementary with each other, and one sense amplifier is provided for each of the bit line pair. The sense amplifier is activated in response to a sense amplifier activating signal, and amplifies the potential difference between the two bit lines that constitute the bit line pair.

A selection switch selects one bit line pair in response to a selection signal from the column decoder, and electrically connects the selected bit line pair to the I/O pairs for read and write of a data to a memory cell.

In a conventional semiconductor device described as in the above, the column decoder is controlled by a delayed signal of a sense amplifier activating signal in order to realize the connection between a predetermined bit line pair and the I/O lines at the time of data read after the amplification of the potential difference of the bit line pair by means of a sense amplifier has proceeded sufficiently well. Namely, the semiconductor memory device is given a constitution in which a sense amplifier amplifying signal is delayed by a predetermined time (6 to 10 ns) by a delay circuit so as to have a selection signal generated by the column decoder after sufficiently long period of time (about 6 to 10 ns) for adequately amplifying the potential difference of the bit line pair following the activation of the sense amplifier by the sense amplifier amplifying signal, then a selection signal is generated when the delayed signal is applied to the column decoder.

Now, the function test of a semiconductor memory cell is carried out generally in the wafer state, and when a defective spot is discovered, the defective spot is corrected with a redundant bit line of a redundant word line to make it usable as a conforming article. One of the various kinds of factors for the generation of defective spots is a read error caused by the formation of electrical connection a bit line pair and the I/O lines during the period from the activation of a sense amplifier to the action of the selection switch before the sense amplifier sufficiently amplified the potential difference of the bit line pair. That is, there is a case where the potential difference of the bit line pair is small due to fluctuations of the characteristics of the transistors or the capacitor elements that constitute the memory cell selected, or a case where the performance of the sense amplifier is deteriorated due to fluctuations of the characteristics of the elements that constitute the sense amplifier. In such a case, it is not possible to raise the amplification of the potential difference of the bit line pair by the sense amplifier to a sufficiently high level during the predetermined time. If the connection between the bit line pair and the I/O lines is formed in such a state, it will not only prolong the read time but also it may lead to the generation of a read error due to reversal of the potential levels of the pair of bit lines depending upon circumstances.

Even for a read error due to the above-mentioned cause, it has been conventional to use the device as a conforming article by replacing the relevant bit line pair by redundant bit lines. However, when there are many bit line pairs that generate the read errors, it is not possible to replace all of the bit line pairs that produce the read errors, so that these has been a defect in that it results in a deterioration of the yield and a rise in the cost.

SUMMARY OF THE INVENTION

Object of the Invention

Therefore, it is the object of the present invention to provide a semiconductor memory device which makes it possible to utilize a semiconductor memory wafer with large time required for the rise of the amplified level of the potential difference of a bit line pair, as a conforming article without the use of a redundant network.

The semiconductor memory device according to the present invention has a memory cell array which includes a plurality of memory cells that are provided in array form and a plurality of bit lines and word lines connected to each of the memory cells where the bit lines are arranged in pairs, sense amplifiers which are provided one for each of the bit line pairs for amplifying the potential difference between the bit lines of the pair in response to an activating signal, a delay circuit which gives to the activating signal to a delay that varies in response to a control signal from a switching circuit and generates a selection signal, and selection switch means which connects the predetermined bit line pair and the I/O lines in response to the selection signal.

It is desirable that the switching circuit includes first output means which permits to change at will the level of the control signal, power terminals outputs a control signal with its level fixed, and second output means which includes a fuse provided between the output terminals.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE INVENTION

Figure 1:
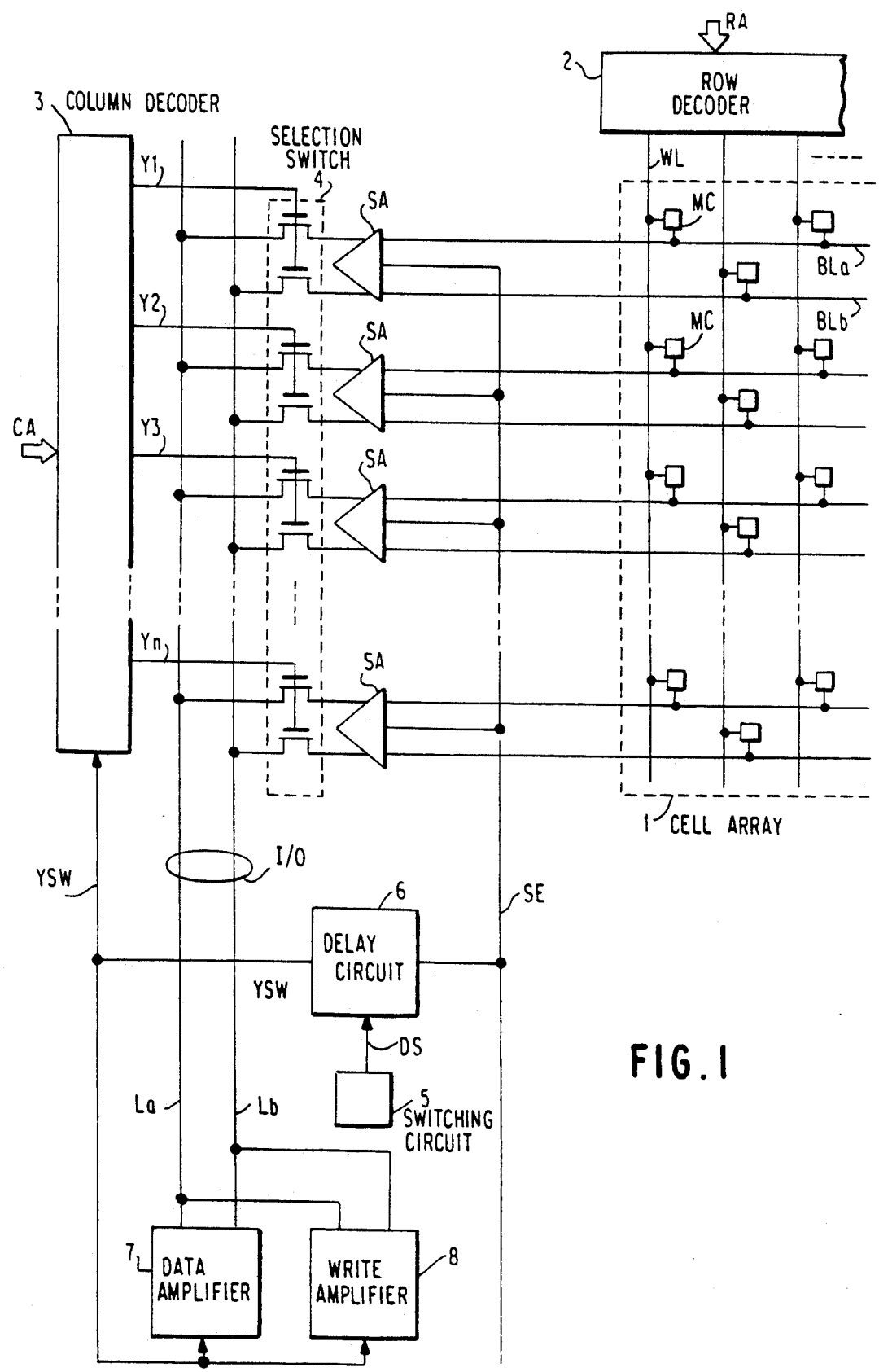
FIG. 1 is a circuit diagram showing the constitution of a semiconductor memory according to an embodiment of the present invention.

Referring to FIG. 1, an embodiment of the present invention will be described. In FIG. 1, a memory cell array 1 is formed by arranging in array the so-called one-transistor one-capacitor type memory cells MC. Bit lines BLa and BLb are connected as a pair to each of the sense amplifiers SA. A sense amplifier SA is activated by a sense amplifier activating signal SE, and amplifies the potential difference between the bit line pair BLa and BLb.

A row decoder 2 selects one of a plurality of word lines WL in response to an input row address (RA), raising its potential to a high level. Upon receipt of a selection signal YSW, a column decoder 3 supplies one of the selection signals $Y_1, Y_2, Y_3, \ldots Y_n$ to a selection switch 4 as an active level (high level) in response to an input column address (CA). The selection switch 4 consists of a group of transistors whose gates respectively receive selection signals $Y_1, Y_2, Y_3, \ldots,$ and $Y_n$ and whose source-drain paths are provided between the input/output ends of the sense amplifiers SAs and the wirings La and Lb that constitute the I/O lines.

A pair of bit lines BLa and BLb that are selected by the selection switch 4 are connected respectively to the wirings La and Lb. The wirings La and Lb complementarily supplies a read data and a write data, and one end of the wirings is connected to a data amplifier 7 and a write amplifier 8. The selection signal YSW is also input to the data amplifier 7 and the write amplifier 8, and controls the respective activations.

A delay circuit 6 generates a selection signal YSW which is obtained by delaying the sense amplifier activating signal SE by a predetermined length of time in response to a control signal DS from a switching circuit 5. Namely, when the control signal DS is at a nonactive level, the delay circuit 6 generates a selection signal YSW which is delayed by a predetermined length of time (6 to 10 ns) from the sense amplifier activating signal SE. When the control signal DS is at the active level, the delay circuit 6 generates a selection signal YSW delayed further by a predetermined length of time (2 to 4 ns) than the selection signal YSW for the case when the selection signal DS is at the nonactive level.

The level setting for the control signal DS generated by the switching circuit 5 is carried out in response to the result of the function test in the wafer state.

Next, referring to FIG. 2, the operation, in particular the read operation, of the present embodiment will be described. First, upon inputting a low active signal RAS from the outside (see FIG. 2(a)), a row address (RA) is supplied externally to the row decoder 2 (FIG. 1) via an address buffer (not shown) (see FIG. 2(c)). The row decoder 2 selects one word line WL in response to the supplied RA, and sends its potential to the high level (see FIG. 2(d)). In response to the information 0 or 1 stored in the memory cell MC which is under control of the word line WL which is brought to the high level, the potential of one of the bit lines BLa and BLb which constitute the bit line pair goes down (see FIG. 2(f)), and the potential levels of the two bit lines become complementary with each other.

Next, the sense amplifier activating signal SE goes to the active level at the time t0 (see FIG. 2(e)), and all of the sense amplifiers SA are activated. The activated amplifiers SA immediately start to amplify the potential difference of the bit line pair, that is, the potential difference between BLa and BLb, and the amplification proceeds until one of the potentials goes to the vicinity of a source potential (Vcc) while the potential of the other goes to the vicinity of the grounding potential (GND) (see the broken lines in FIG. 2(f)).

Next, when a low active signal CAS is input from the outside (see FIG. 2(b)), a column address (CA) is supplied externally to the column decoder 3 via the address buffer (see FIG. 2(c)). When the level of the control signal DS is at the nonactive level, the delay circuit 6 delays the sense amplifier activating signal SE by a length of time, and sends the selection signal YSW to the active level at the time t10 (see the broken lines in FIG. 2(g)).

Here, if the sense amplifier SA operates as it is designed, then the potential difference between the lines BLa and BLb that constitute a bit line pair should be close to the source potential Vcc at the time t10 where the selection signal YSW goes to the active level, as indicated by the broken lines in FIG. 2(f). As the selection signal YSW goes to the active level the column decoder sends either one of the selection signals $Y_1, Y_2, \ldots,$ and $Y_n$ to the active level (high level) in response to the input signal CA, so that a bit line pair that corresponds to the chosen signal is selected by the selection switch 4 (see FIG. 1).

Since, then, the bit lines BLa and BLb of the bit line pair selected by the selection switch 4 are electrically connected to the wirings La and Lb, respectively, one of the wirings La and Lb maintains the Vcc level while the potential of the other wiring is brought to the low level by the sense amplifier SA related to the selected bit line pair.

The potential difference between the wirings La and Lb which is further amplified by the data amplifier 7 that is activated by the selection signal YSW is output to the input and output terminals (not shown) as a read data through a common data bus, thereby completing the read operation of one data.

The read operation as described in the above is what is expected to take place when the sense amplifier SA amplifies the potential difference between the lines of the bit line pair within the prescribed length of time. However, there can arise a case where the potential difference of the bit line pair remains small due to fluctuations in the characteristics of the transistors or capacity elements that constitute the selected memory cell, or a case where the performance of the sense amplifier is deteriorated due to fluctuations in the characteristics of the elements that constitute the sense amplifier. In such a case, the potential difference of the bit line pair at the time t10 will not be amplified wide enough as is indicated by the solid lines in FIG. 2(f). If, in this state, the selection signal YSW goes to the active level and the column decoder 3 raises the level of one of the signals for the selection switch 4 to the active level, there arises a situation in which a bit line pair whose potential difference is not yet amplified sufficiently well is connected to the I/O lines. As a result, not only it takes a longer time for data reading but also there may arise a read error due to the reversal of the levels of the pair of bit lines depending upon circumstances.

Such a read error is detected by the function test when the semiconductor memory device is in the wafer state. In the past, when there is generated a read error, the device unit is made to act as a conforming article by replacing the defective parts by the use of a redundant circuit. However, when there occurred too many defective parts which precludes the possibility of replacement with a redundant circuit, the unit is handled as a nonconforming article. The present inventor discovered, however, that the read error caused by the large value of the time required for the rise of amplification of the potential difference of a bit line pair can be saved by giving a predetermined delay to the selection signal YSW. By adopting such a measure, products that had to be handled as nonconforming articles in the past can be converted to conforming articles without depending upon the use of a redundant circuit.

Namely, when a read error is detected by the function test, the device is set so as to have the switching circuit 5 generates a control signal DS of the active level. When the control signal DS goes to the active level, the delay circuit 6 changes the delay time so as to let the selection signal YSW go to the active level (see the solid lines in FIG. 2(g)) at the time t20 by further delaying the delay time DT0 between the time when the sense amplifier activating signal SE went to the active level and the time when the selection signal YSW goes to the active level (FIG. 2) is further delayed by DT1. While the potential difference between the lines BLa and BLb of the bit line pair is sufficiently amplified at the time t20 (see the solid lines in FIG. 2(f)), if the selection signal YSW goes to the active level and the connection between the bit line pair BLa and BLb, and the I/O lines is formed at that time, the read operation can be executed normally.

In a device product whose read error is detected by the function test, the read error can be dissolved by setting the switching circuit 5 so as to generate an active level control signal DS. In this case, by permanently setting the switching circuit 5 so as to make the control signal DS to go to the active level, it becomes possible to convert the products which have been handled to be defective in the past to conforming articles, which can be made to contribute to an improvement of the yield and a reduction of the cost. The delay DT in the read time accompanying the introduction of the above-mentioned technique is 2 to 4 ns or so. A delay in the read time of this order can fully be compensated for by a remarkable improvement of the yield.

In the above, an embodiment of the present invention has been described in detail with reference to the read operation. However, the present invention is applicable also to the write operation so that a brief description will be presented in what follows.

In the write operation, the procedure up to the operation (time t20 in FIG. 2) of the selection of a bit line pair by a row address (RA) and a column address (CA) is the same as in the read operation. Thereafter, in the write operation, complementary data that are amplified by a write amplifier 8 (see FIG. 1) that is activated by the receipt of a selection signal YSW are supplied to the wirings La and Lb that constitute the I/O lines, and the complementary data are supplied to a bit line pair by the switch circuit. The write data are written forcibly to a predetermined memory cell MC, completing the write operation.

Figure 3:
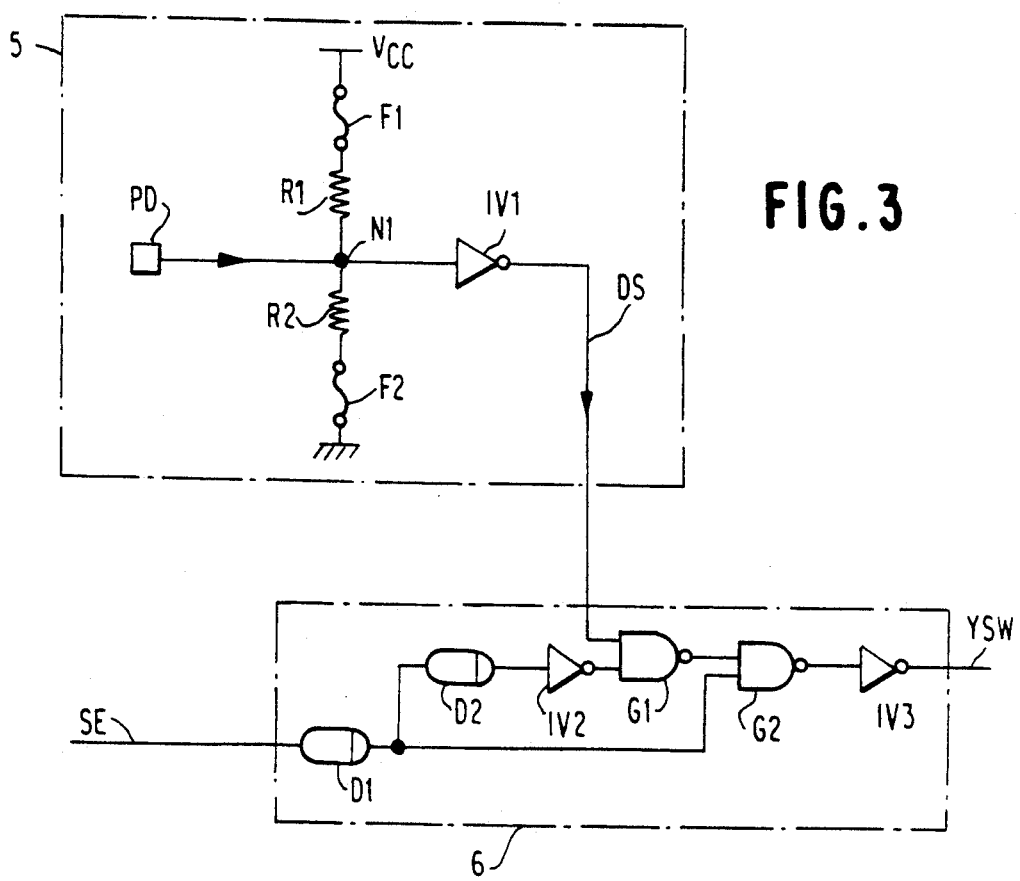
FIG. 3 is a circuit diagram showing an example of specific constitution of a switching circuit and a delay circuit shown in FIG. 1.

Next, referring to FIG. 3, specific example of the switching circuit 5 and the delay circuit 6 of the embodiment in FIG. 1 will be described. The switching circuit 5 includes a pad PD connected to a node N, a resistor R1 with one end connected to the node N1 and the other end connected to a fuse F1, a fuse F1 connected between the resistor R1 and a power terminal Vcc, a resistor R2 with its one end connected to the node N1 and the other end connected to a fuse F2, a fuse F2 connected between the resistor R2 and a grounding terminal, and an inverter circuit INV1.

On the other hand, the delay circuit 6 includes a delay element D1 which has the sense amplifier activating signal SE as its input, a delay element D2 which further delays the output signal of the delay element D1, a NAND gate G1 which has as its inputs the output of the switching circuit 5 and the signal obtained by passing the output of the delay element D2 through an inverter circuit INV2, a NAND gate G2 which has as its inputs the output of the delay element D1 and the output of the NAND gate G1, and an inverter circuit INV3 which has the output of the NAND gate G2 as its input.

Next, the operation of the switching circuit 5 and the delay circuit 6 will be described. First, in the function test of the semiconductor memory device in the wafer state, the output of the inverter circuit INV1, that is, the control signal DS is brought to a low level in the open state of the pad PD. Since the control signal DS is at the low level, the sense amplifier activating signal SE propagates along the route of the delay element D1, the NAND gate G2, and the inverter INV3 to produce a selection signal YSW which is delayed by the time DT0 (see FIG. 2).

A function test is carried out at this stage, and in the event that a result is obtained that the product is nondefective, the fuse F2 of the switching circuit 5 is melted, and by so doing the control signal DS is fixed permanently to the low level. In this way, there is obtained a semiconductor memory device with an ordinary read speed in which the selection signal YSW is brought to the active level after passage of a time of DT0 following the attainment of the active level by the sense amplifier activating signal SE.

On the other hand, in the event that a read error is detected as a result of the function test, the output of the inverter circuit INV1, that is, the control signal DS is brought to the high level by connecting the pad PD to the grounding potential. Since the control signal DS is at the high level, the sense amplifier activating signal SE propagates along the route of the delay element D1, the delay element D2, the inverter circuit INV2, the NAND gate G1, the NAND gate G2, and the inverter circuit INV3, and becomes a selection signal YSW which is delayed by the time DT0+DT1 (see FIG. 2).

If a result is obtained by another function test in this stage that the unit is nondefective, the fuse F1 of the switching circuit 5 is melted, and by so doing the control signal DS is fixed permanently to the high level. In this way, there is obtained a semiconductor memory device with a read speed which is slower by a time DT1 than the ordinary read speed in which the selection signal YSW is brought to the active level after passage of a time of DT0+DT1 following the attainment of the active level by the sense amplifier activating signal SE.

If a test result is obtained that there still persists a read error even after the pad PD is given the grounding potential, then the present technique will no longer have a room to exhibit its effect. In that case, there exists no other way than to rely upon the conventional technology of dealing the defective spots with a redundant circuit.

Figure 4:
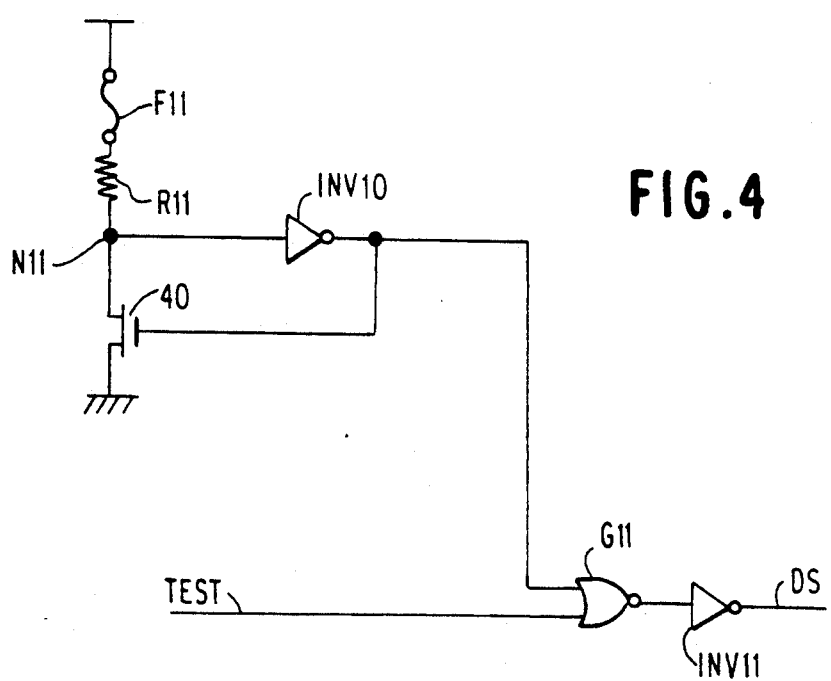
FIG. 4 is a circuit diagram showing another specific constitution of the switching circuit shown in FIG. 1.

Next, referring to FIG. 4, another example of the switching circuit 5 will be described. This switching circuit includes a resistor R11 with its one end connected to a node N11 and the other end connected to a fuse F11, the fuse F11 which is connected between the resistor R11 and a power terminal Vcc, an N-channel MOS transistor 40 with its source-drain path connected between the node N11 and a grounding terminal, an inverter circuit INV10 having the node N11 as its input end, and its output connected to the gate of the transistor 40, a NOR gate G11 having the output of the inverter circuit INV10 and a test signal TEST as its inputs, and an inverter circuit INV11 having the output of the NOR gate G11 as its input.

In this switching circuit 5, a function test is carried out in the state where the control signal DS is at the low level by bringing the TEST signal to the low level. If a read error is discovered as a result, the function test is given for a second time in the state where the control signal DS is at the high level by bringing the TEST signal to the high level. If no error is generated when the control signal DS is at the high level, the fuse F11 is melted, and the control signal DS is fixed permanently to the high level. As described in the above, a pad for switching can be done away with in this switching circuit 5. In this case, an internal signal such as a low active write enable (WE) signal may be employed as the TEST signal.

Figure 5:
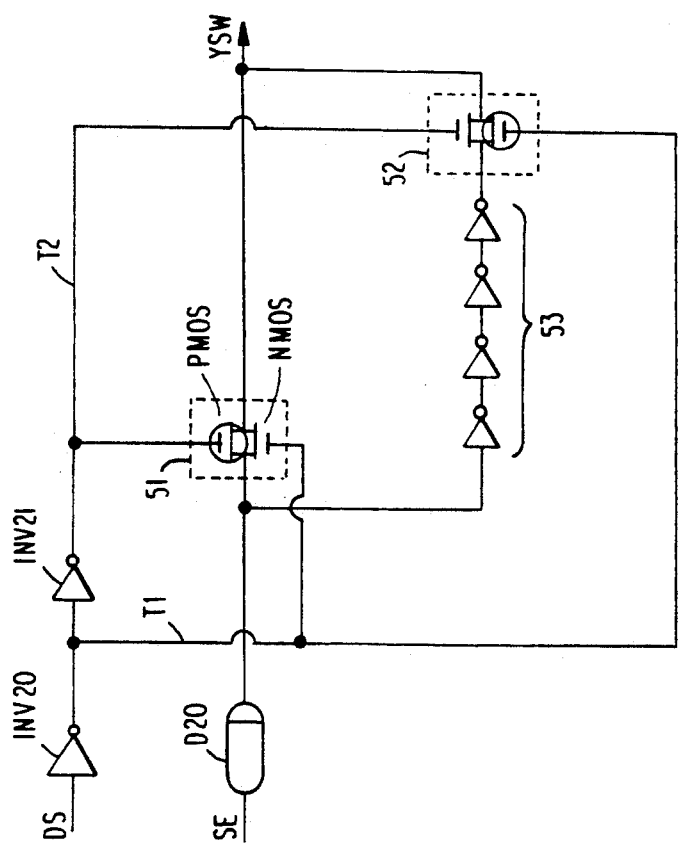
FIG. 5 is a circuit diagram showing another specific constitution of the delay circuit shown in FIG. 1.

Next, referring to FIG. 5, another example of the delay circuit 6 will be described. This delay circuit includes a delay element D20, a signal T1 obtained by passing the control signal D3 through an inverter circuit INV20, transfer gates 51 and 52 each consisting of a P-channel transistor and an N-channel transistor whose energization is respectively controlled by a signal T2 which is obtained by further passing the output of the inverter circuit INV20 through an inverter circuit INV21, and a delay element 53 formed by connecting four CMOS inverters in series.

Figure 2:
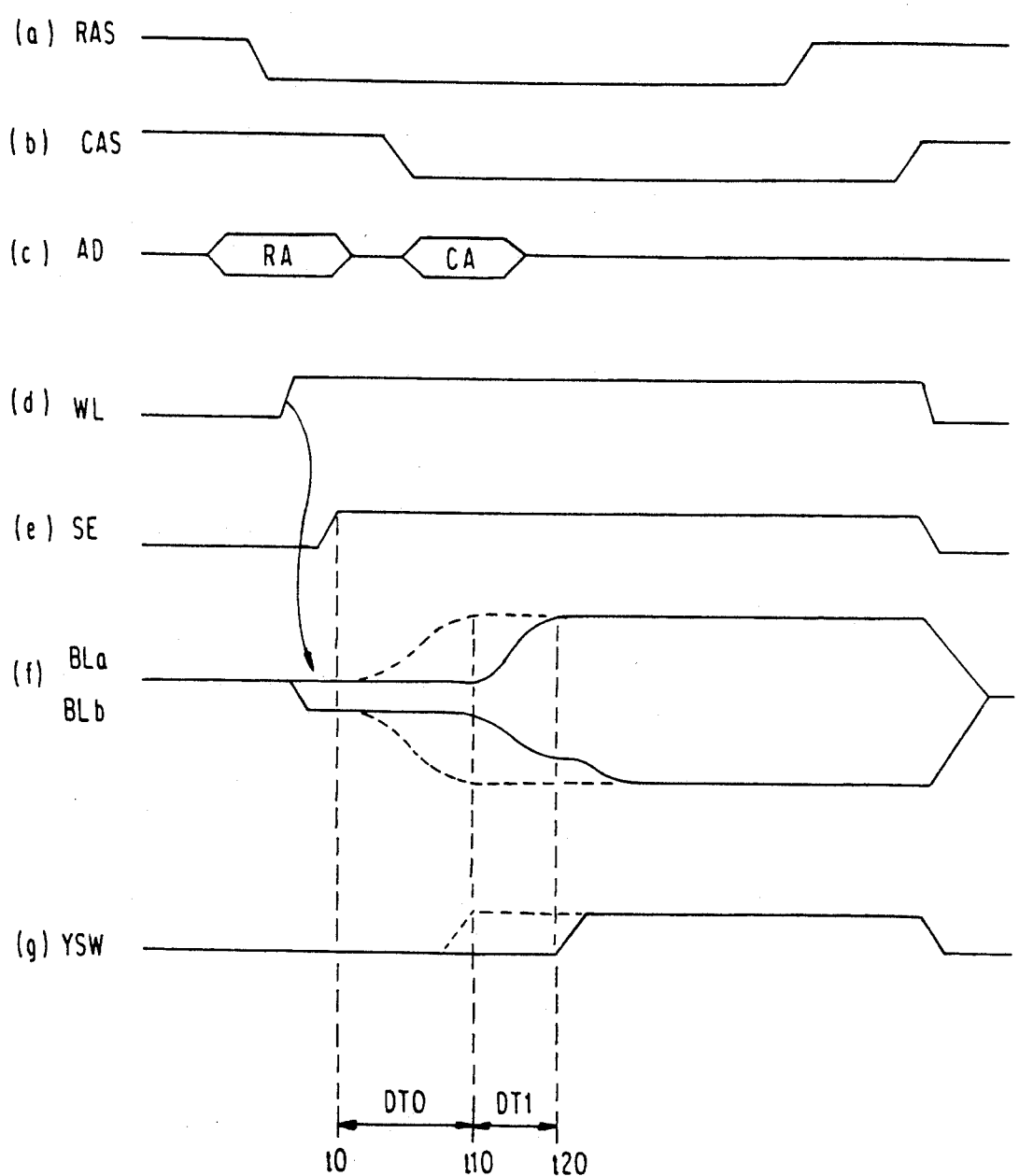
FIG. 2 is a waveform diagram for explaining the operation of the semiconductor memory device shown in FIG. 1.

In this embodiment, when the control signal DS is at the low level, the sense amplifier activating signal SE propagates along the route of the delay element D20 and the transfer gate 52, and becomes a selection signal YSW which is delayed by a time DT0 (see FIG. 2). On the other hand, when the control signal DS is on the high level, the sense amplifier activating signal SE propagates along the route of the delay element D20, the delay element 53, and the transfer gate 52, and becomes a selection signal YSW which is delayed by a time DT0+DT1 (see FIG. 2).

Figure 6:
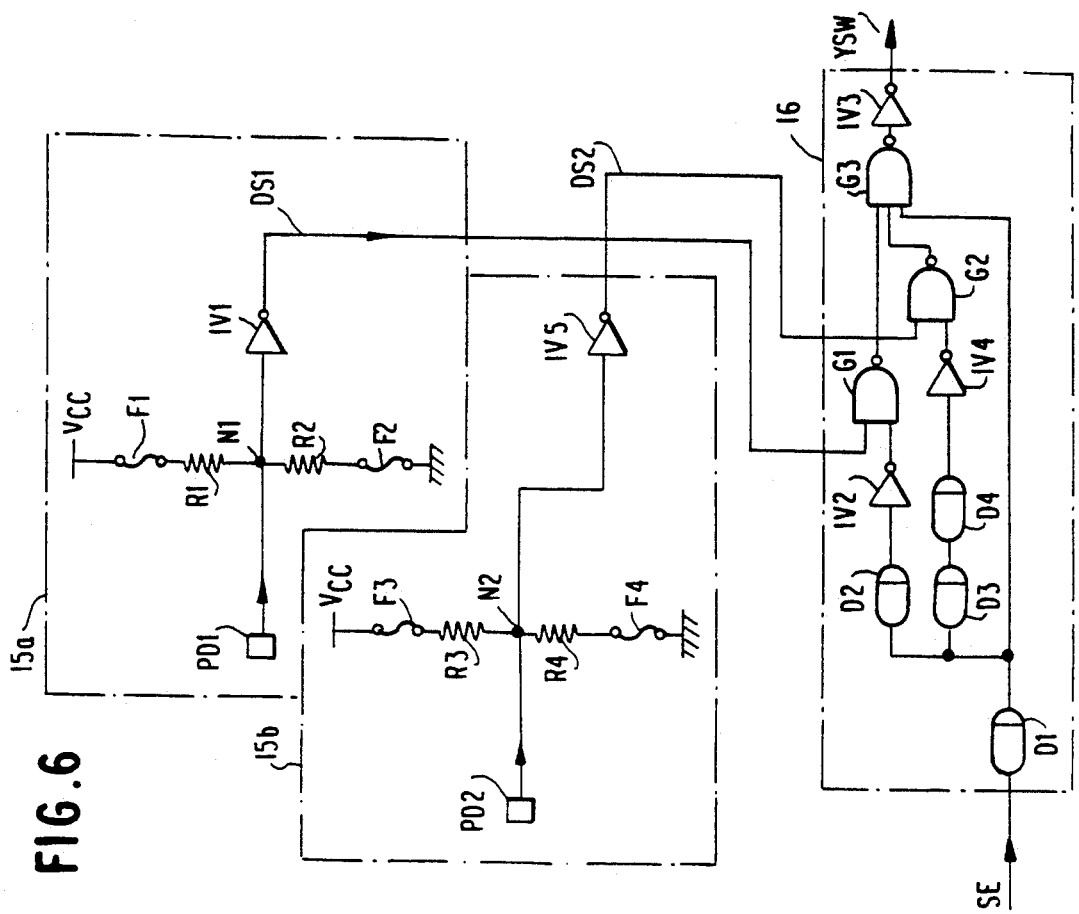
FIG. 6 is a circuit diagram showing still another specific constitution of the switching circuit and the delay circuit shown in FIG. 1.

Next, referring to FIG. 6, another example of the switching circuit, 15, and the delay circuit, 16, will be described. In these circuit examples, two switching circuits 15a and 15b which have a similar construction as the switching circuit 5 shown in FIG. 2 are provided, and a constitution is adopted in which both of the control signals DS1 and DS2 are at the low level or one of them goes to a high level.

The delay circuit 16 is equipped with three routes along which the sense amplifier activating signal SE can propagate. Namely, when both of the control signals DS1 and DS2 are at the low level, the sense amplifier activating signal SE propagates along the route of a delay element D1, a NAND gate G3, and an inverter circuit INV3. When the control signal DS1 is at the high level, the sense amplifier activating signal SE goes by way of the delay elements D1 and D2, an inverter circuit INV2, a NAND gate G1, the NAND gate G3, and the inverter circuit INV3. On the other hand, when the control signal DS2 is at the high level, the sense amplifier activating signal SE passes through the route of the delay elements D1, D3, and D4, an inverter circuit INV4, a NAND gate G2, the NAND gate G3, and the inverter circuit INV3.

As in the above, it is possible to produce three stages of delay for the selection signal YSW obtainable by giving a selective delay to the sense amplifier activating signal SE by employing two kinds of control signals DS1 and DS2. Since a delay of the selection signal YSW means to increase the access time to the corresponding extent, it is desirable to reduce the delay time. According to the present embodiment it becomes possible to minimize the amount of the delay.

It should be mentioned that two kinds of control signals have been employed in the present embodiment, but a similar effect is obtainable by the present invention even if the control signals of three or more kinds are employed. In that case, one only needs to provide three or more switching circuits with construction similar to the construction of the switching circuit as shown in FIG. 3, and four or more routes for the propagation of the sense amplifier activating signal SE as the delay circuit.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device, comprising: a memory cell array including a plurality of word lines, a plurality of bit lines and a plurality of memory cells each connected to one of said word lines and one of said bit lines, a plurality of sense amplifiers each coupled to an associated one of said bit lines and activated by a sense-enable signal to amplify a potential appearing on said associated bit line, a data line through which a read-data signal read out of said memory cell array is transferred in a data read mode and a write-data signal to be written into said memory cell array is transferred in a data write mode, a selection circuit provided between said data line and each of said sense amplifiers and activated by a select-enable signal to form an electrical path between said data line and a selected one of said sense amplifiers, and a delay circuit receiving said sense-enable signal and a control signal and producing said selection-enable signal, said delay circuit delaying said sense-enable signal by a first period of time to produce said select-enable signal when said control signal takes a first logic level and delaying said sense-enable signal by a second period of time to produce said select-enable signal when said control signal takes a second logic level, said first period of time being different from said second period of time.

2. The memory device as claimed in claim 1, further comprising a data amplifier coupled to said data line to receive said read-data signal and a write amplifier coupled to said data line to supply said write-data signal, said data amplifier being activated in response to said select-enable signal in said data read mode, and said write amplifier being activated in response to said select-enable signal in said data write mode.

3. The memory device as claimed in claim 1, wherein said control signal is generated by a switching circuit which includes a fuse and a signal generation circuit, said signal generation circuit generating said control signal with said first logic level when said fuse is blown and with said second logic level when said fuse is not blown.

4. A semiconductor memory device, comprising: a plurality of word lines, a plurality of pairs of bit lines, and a plurality of memory cells each coupled to one of said word lines and one of said pairs of bit lines, a row decoder coupled to said word lines for selecting one of said word lines in response to row address information, a plurality of sense amplifiers each coupled to an associated one of said pairs of bit lines and activated by a sense-enable signal to amplify a potential difference between the associated pair of bit lines, a pair of data lines, a plurality of pairs of selection transistors each coupled between said pair of data liens and an associated one of said sense amplifiers, a column decoder coupled to said pairs of selection transistors for turning one of said pairs of selection transistors ON in response to a selection signal and column address information, and a delay circuit delaying said sense-enable signal and producing a delayed signal, said delayed signal being supplied to said column decoder as said selection signal, said delay circuit delaying said sense-enable signal by a first period of time in a first state and by a second period of time in a second state, said first period of time being different from said second period of time.

5. The memory device as claimed in claim 4, wherein said delay circuit is brought into said first state by a first level of a control signal and into said second state by a second level of said control signal, said control signal being generated by a control circuit including a fuse, said control signal assuming said first level when said fuse is blown and said second level when said fuse is not blown.

6. The memory device as claimed in claim 5, wherein said pair of data lines are coupled to a data amplifier which is activated by said selection circuit in a data read mode and to a write amplifier which is activated by said selection signal in a data write mode.

* * * * *